United States Patent
Kim et al.

(10) Patent No.: US 7,439,811 B2
(45) Date of Patent: Oct. 21, 2008

(54) BROADBAND LOW NOISE AMPLIFIER AND RF SIGNAL AMPLIFICATION METHOD OF THE SAME

(75) Inventors: Dae-yeon Kim, Suwon-si (KR); Hyun-koo Kang, Yongin-si (KR); Jae-young Ryu, Suwon-si (KR); Ju-ho Son, Suwon-si (KR); Jeong-ho Lee, Suwon-si (KR)

(73) Assignee: Samsung Electronics Co., Ltd., Suwon (KR)

(*) Notice: Subject to any disclaimer, the term of this patent is extended or adjusted under 35 U.S.C. 154(b) by 154 days.

(21) Appl. No.: 11/431,555

(22) Filed: May 11, 2006

(65) Prior Publication Data

US 2007/0001768 A1 Jan. 4, 2007

(30) Foreign Application Priority Data

Jun. 30, 2005 (KR) .............. 10-2005-0058273

(51) Int. Cl.
*H03F 1/44* (2006.01)
(52) U.S. Cl. .................... 330/305; 330/254
(58) Field of Classification Search ........ 330/305, 330/252, 253, 254
See application file for complete search history.

(56) References Cited

U.S. PATENT DOCUMENTS

| 5,227,681 | A | * | 7/1993 | Koyama et al. ............ 327/65 |
| 6,549,071 | B1 | | 4/2003 | Paul et al. |
| 6,570,447 | B2 | * | 5/2003 | Cyrusian et al. ........... 330/254 |
| 2005/0057305 | A1 | * | 3/2005 | Krone ........................ 330/254 |
| 2007/0024377 | A1 | * | 2/2007 | Wang et al. ................. 330/305 |

FOREIGN PATENT DOCUMENTS

| JP | 08-213855 A | 8/1996 |
| JP | 2001-119251 A | 4/2001 |

* cited by examiner

*Primary Examiner*—Robert J. Pascal
*Assistant Examiner*—Khiem D Nguyen
(74) *Attorney, Agent, or Firm*—Sughrue Mion, PLLC

(57) ABSTRACT

A broadband low noise amplifier and amplification method is provided. The broadband low noise amplifier includes an input terminal into which a radio frequency (RF) signal received by an antenna is input, an output terminal from which an amplified RF signal is output, at least one gain control part connected in parallel with loads of the output terminal to adjust the gain of the amplified RF signal, and at least one load tuning part that resonates with loads of the output terminal to adjust the resonance frequency of the load impedance. The method includes amplifying the input RF signal and outputting the amplified RF signal to an output terminal, where a gain of the amplified RF signal is adjusted by switching operations of at least one switching device connected in parallel with a load of the output terminal.

17 Claims, 5 Drawing Sheets

Prior Art

AC Response

A: (4.9G 19.9356)
B: (6G 20.0722)

delta: (1.1G 136.648m)
slope: 124.225p

BROADBAND LOW NOISE AMPLIFIER AND RF SIGNAL AMPLIFICATION METHOD OF THE SAME

CROSS-REFERENCE TO RELATED APPLICATIONS

This application claims priority from Korean Patent Application No. 10-2005-0058273 filed on Jun. 30, 2005 in the Korean Intellectual Property Office, the disclosure of which is incorporated herein by reference in its entirety.

BACKGROUND OF THE INVENTION

1. Field of the Invention

Apparatuses and methods consistent with the present invention are directed to low noise amplification. More particularly, the present invention relates to a broadband low noise amplifier and a radiofrequency (RF) signal amplification method of the same.

2. Description of the Related Art

Generally, an amplifier is needed in order to amplify a signal that is output through an antenna when a wireless communication apparatus transmits a signal, or to provide proper gains to the amplitude of a signal input into an antenna. In the former case a power amplifier is required, and in the latter case a low noise amplifier is required.

The low noise amplifier amplifies, in a manner generating little noise, a weak radio frequency (RF) signal received by a wireless system through an antenna.

FIG. 1 illustrates an example of a wireless communication apparatus comprising a low noise amplifier. First, operations of the wireless communication apparatus relating to the transmission process will be described.

A baseband signal output from a baseband processor 190 is amplified by a baseband amplifier 140. The amplified baseband signal is mixed with an oscillation signal generated by an oscillator 180 in a up-mixer 130 to thereby create an RF signal. Most conventional communication systems do not directly convert a baseband signal into a RF signal. Instead, they first convert the baseband signal to an intermediate frequency (IF) signal and then convert the IF signal to an RF signal. The RF signal is amplified by a power amplifier 120 and then output through an antenna 110. The power amplifier 120 used in the transmission process may be constructed with multi-stage amplifiers so as to reduce distortion and obtain high gains. For example, a wireless communication apparatus may include a pre-power amplifier and a power amplifier.

Now, operations of the wireless communication apparatus relating to the reception process will be described.

The RF signal input through the antenna 110 is amplified by way of the low noise amplifier 150. The amplified RF signal is converted into a baseband signal by the down-mixer 160, and is amplified by the baseband amplifier 170. Most of the current conventional communication systems do not directly convert an RF signal into a baseband signal; they first convert the RF signal to an intermediate frequency (IF) signal and then convert the IF signal to a baseband signal. The amplified baseband signal is then transmitted to the baseband processor 190. The low noise amplifier 150 may also be constructed of multi-stage amplifiers so as to reduce distortion and obtain high gains.

A switch 115 selects between an RF signal output from the power amplifier 120 and intended for the antenna 110, and an RF signal received via the antenna 110 and destined for the low noise amplifier 150. In the full duplex mode communication system, a duplexer may be used instead of the switch 115.

As described above, the power amplifier or the low noise amplifier used in the wireless communication apparatus should provide sufficient variable gains.

The construction of the low noise amplifier 150 of the wireless communication apparatus illustrated in FIG. 1 is shown in FIG. 2.

The low noise amplifier shown in FIG. 2 has the structure of a differential cascade amplifier, comprising a first cascade amplifier including a common source transistor M1 and a common gate transistor M3, and a second cascade amplifier including a common source transistor M2 and a common gate transistor M4.

An RFin+ signal received via an antenna is supplied to the gate of the common source transistor M1 of the first cascade amplifier. The common gate transistor M3 improves the frequency response of the first cascade amplifier. The RFin+ signal passing through the first cascade amplifier is output through an output terminal (RFout+). As illustrated, the RFin+ input terminal is coupled to the common source transistor M1 using an inductor L1 for input matching and noise matching.

Likewise, an RFin− signal input through the same antenna is supplied to the gate of the common source transistor M2 of the second cascade amplifier. The common gate transistor M4 improves the frequency response of the second cascade amplifier. The RFin− signal passing through the second cascade amplifier is output through an output terminal (RFout−). As illustrated, the input terminal of RFin− is coupled to the common source transistor M2 using an inductor L2 for input matching and noise matching.

A gain control section A comprises a transistor M5 which functions as a switch and is provided with a switching signal Gtune5 to turn the transistor M5 on or off. Load 1 and load 2 are positioned at the output terminals, RFout+ and RFout−. Load 1 and load 2 are inductors, which act as loads of the low noise amplifier.

The RF signal received by the antenna is converted into a differential signal through a Balun (not shown) and then flows into an input terminal of the low noise amplifier. The input RF signal is amplified through the transistors M1 and M3 and the transistors M2 and M4, and is output through the output terminals RFout+ and RFout−.

Input matching is conducted to reduce loss of an input signal, and output matching is conducted to reduce output loss. In addition, noise matching is conducted to reduce noise generation. Input matching and noise matching may be implemented by properly adjusting transistors M1 and M2 and inductors L1 and L2.

As described above, the conventional low noise amplifier has the properties of low noise and high gain, but it also has the property of narrow band in impedance matching.

In other words, since impedance matching in the form of an LC resonance is conducted at a load, the low noise amplifier has the highest gain at the resonance frequency, but its gain decreases at other frequencies.

SUMMARY OF THE INVENTION

The present invention provides a broadband low noise frequency with retaining the properties of gain and noise of the conventional low noise amplifier.

According to an exemplary aspect of the present invention, there is provided a broadband low noise amplifier comprising an input terminal into which an RF signal received by an antenna is input, an output terminal from which an amplified RF signal is output, at least one gain control part connected in parallel with loads of the output terminal to adjust the gain of the amplified RF signal, and at least one load tuning part that resonates with loads of the output terminal to adjust the resonance frequency of the load impedance.

According to another exemplary embodiment of the present invention, there is provided an RF signal amplification method comprising inputting an RF signal received from an antenna into an input terminal, and amplifying the input RF signal and outputting the amplified RF signal to an output terminal, wherein the gain of the amplified RF signal is adjusted by switching operations of a switching device connected in parallel with a load of the output terminal, and the resonance frequency of a load impedance at the output terminal is determined according to a value of at least one capacitor that resonates with the load.

BRIEF DESCRIPTION OF THE DRAWINGS

The above and other aspects of the present invention will become more apparent by describing in detail exemplary embodiments thereof with reference to the attached drawings in which.

DETAILED DESCRIPTION OF EXEMPLARY EMBODIMENTS OF THE INVENTION

The present invention will now be described more fully with reference to the accompanying drawings, in which exemplary embodiments of the invention are shown. Advantages and features of the present invention and methods of accomplishing the same may be understood more readily by reference to the following detailed description of exemplary embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims.

Figure 1:
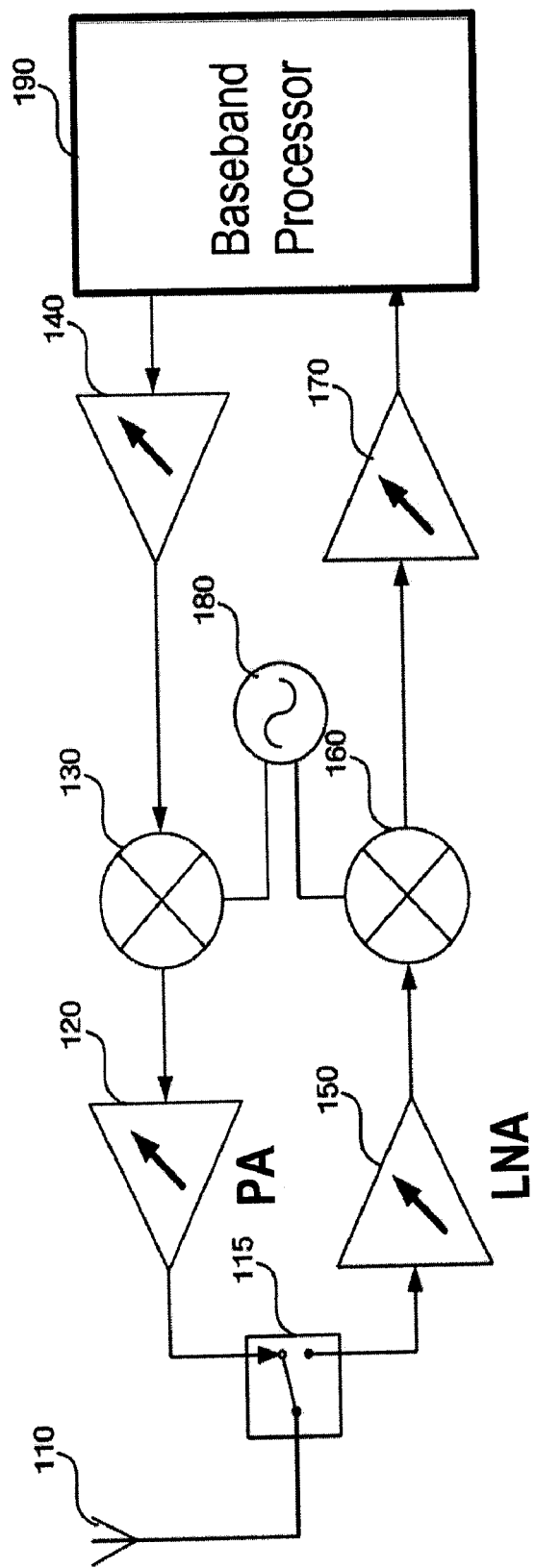
FIG. 1 is a diagram illustrating a conventional wireless communication apparatus.
Figure 2:
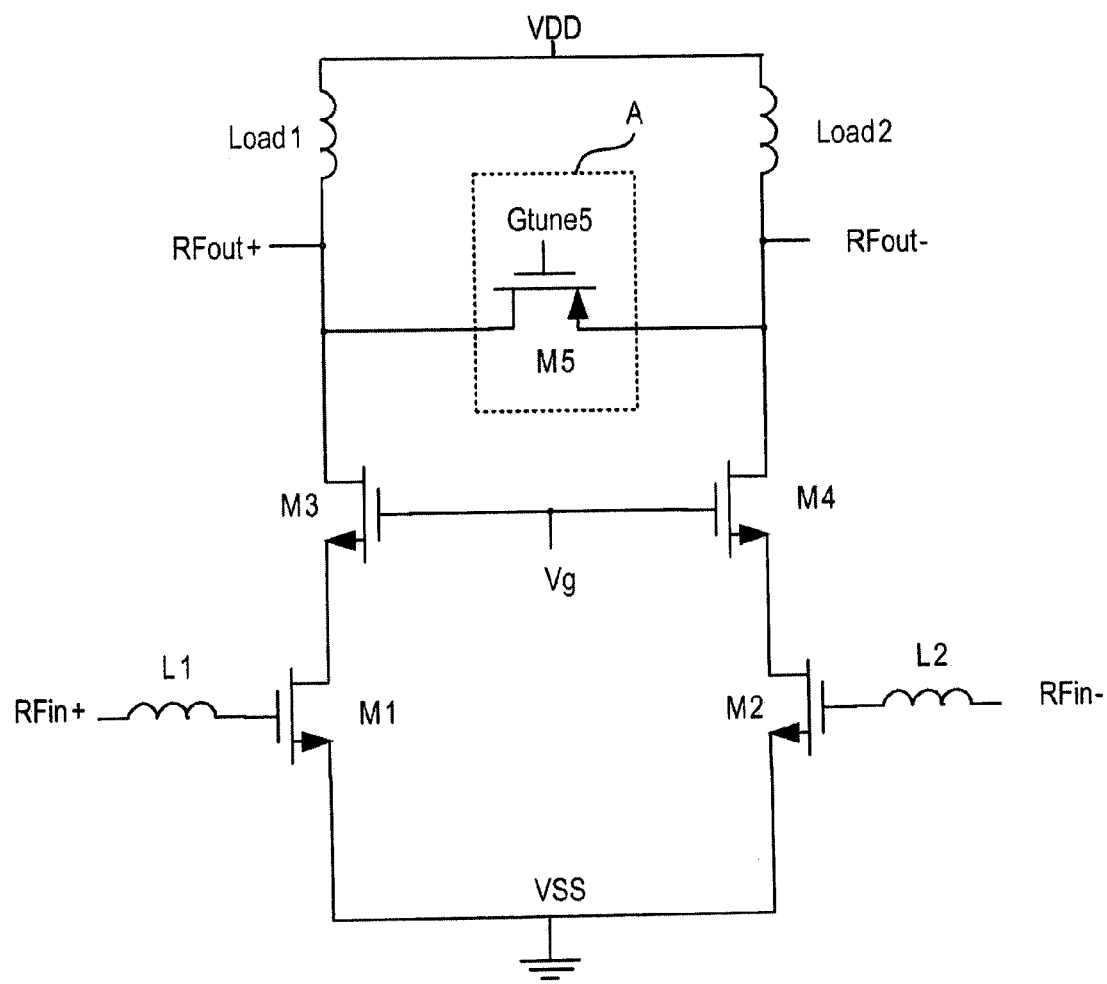
FIG. 2 is a diagram illustrating a conventional low noise amplifier.
Figure 3:
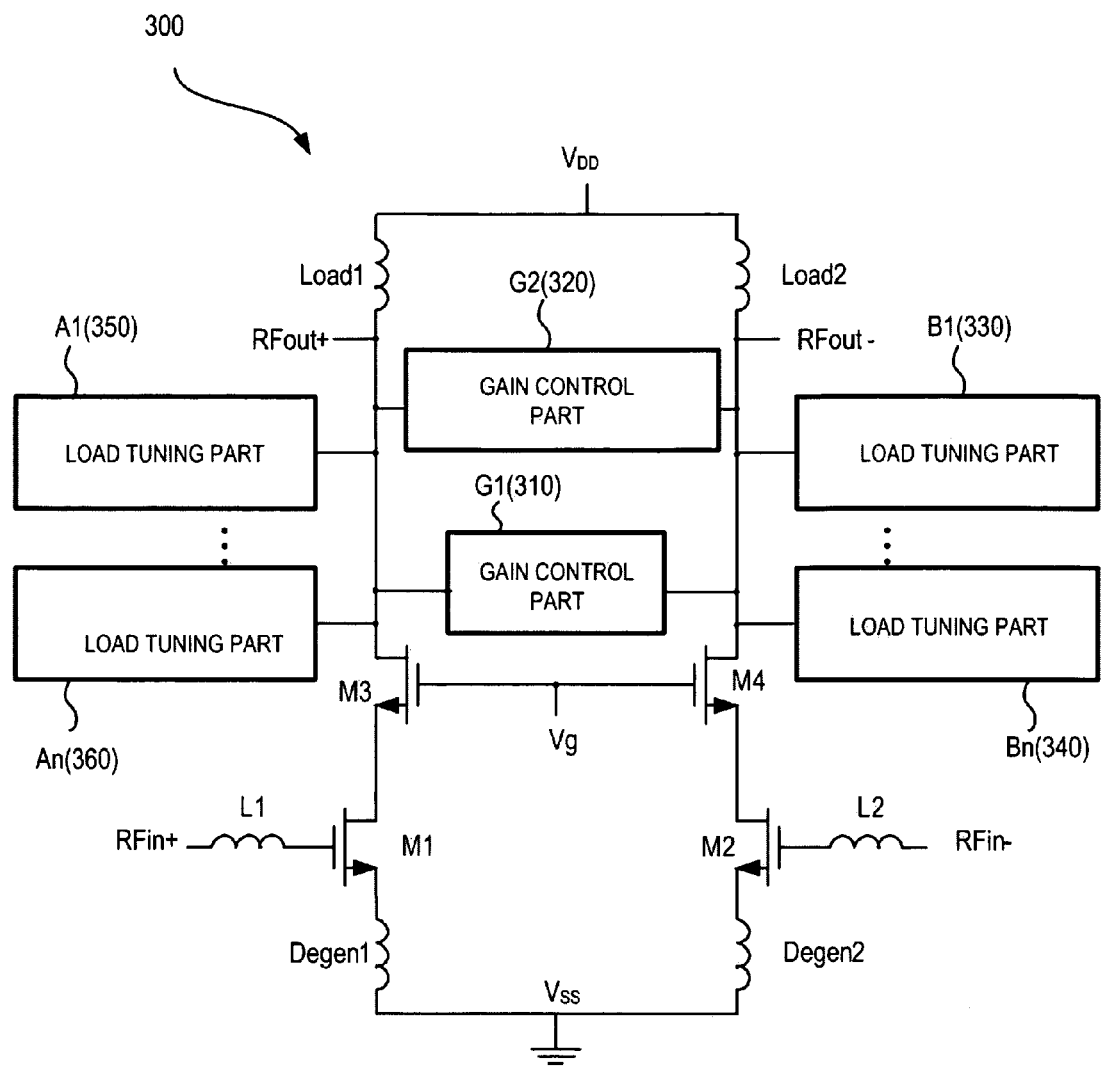
FIG. 3 is a diagram illustrating a broadband low noise amplifier according to an exemplary embodiment of the present invention.

FIG. 3 is a diagram illustrating a broadband low noise amplifier according to an exemplary embodiment of the present invention. The wideband low noise amplifier 300 has the structure of a differential cascade amplifier, comprising a first cascade amplifier including a common source transistor M1 and a common gate transistor M3, and a second cascade amplifier including a common source transistor M2 and a common gate transistor M4.

An RFin+ signal received via an antenna is supplied to a gate of the common source transistor M1 of the first cascade amplifier. The common gate transistor M3 improves the frequency response of the first cascade amplifier. The RFin+ signal passing through the first cascade amplifier is output through an output terminal (RFout+). As illustrated, inductors L1 and Degen1 are coupled to an RFin+ input terminal for input matching and noise matching.

Likewise, an RFin− signal received via the same antenna is supplied to a gate of the common source transistor M2 of the second cascade amplifier. The common gate transistor M4 improves the frequency response of the second cascade amplifier. The RFin− signal passing through the second cascade amplifier is output through an output terminal (RFout−). As illustrated, inductors L2 and Degen2 are coupled to an RFin− input terminal for input matching and noise matching. Input matching and noise matching may be implemented by properly adjusting transistors M1 and M2, inductors Degen1 and Degen2 and inductors L1 and L2, as is known in the art.

A first gain control part G1 310 and a second gain control part G2 320 are positioned between an RFout+ output terminal and an RFout− output terminal. Gains of the broadband low noise amplifier 300 may be determined according to switching operations of the first gain control part G1 310 and the second gain control part G2 320.

The first gain control part G1 310 and the second gain control part G2 320 may be constructed in various forms as long as the switching operations can be conducted.

Further, Load1 and Load2 consisting of inductors, and acting as loads of the low noise amplifier are positioned at the output terminals (RFout+ and RFout−), and the frequency may be tuned to any desired value according to the input RF signal by connecting a plurality of load tuning parts A1 350, . . . An 360, and B1 330, . . . Bn 340 in parallel to the output terminals of RFout+ and RFout− respectively. By doing this, the broadband property of the low noise amplifier can be obtained. The load tuning parts 330, 340, 350 and 360 may be embodied with combinations of capacitors and other devices to conduct switching operations.

The RF signal received by the antenna is converted into a differential signal through a Balun (not shown) and then enters an input terminal of the low noise amplifier 300. The input RF signal is amplified through transistors M1 and M2 and transistors M3 and M4 and appears at the output terminals RFout+ and RFout−.

Figure 4:
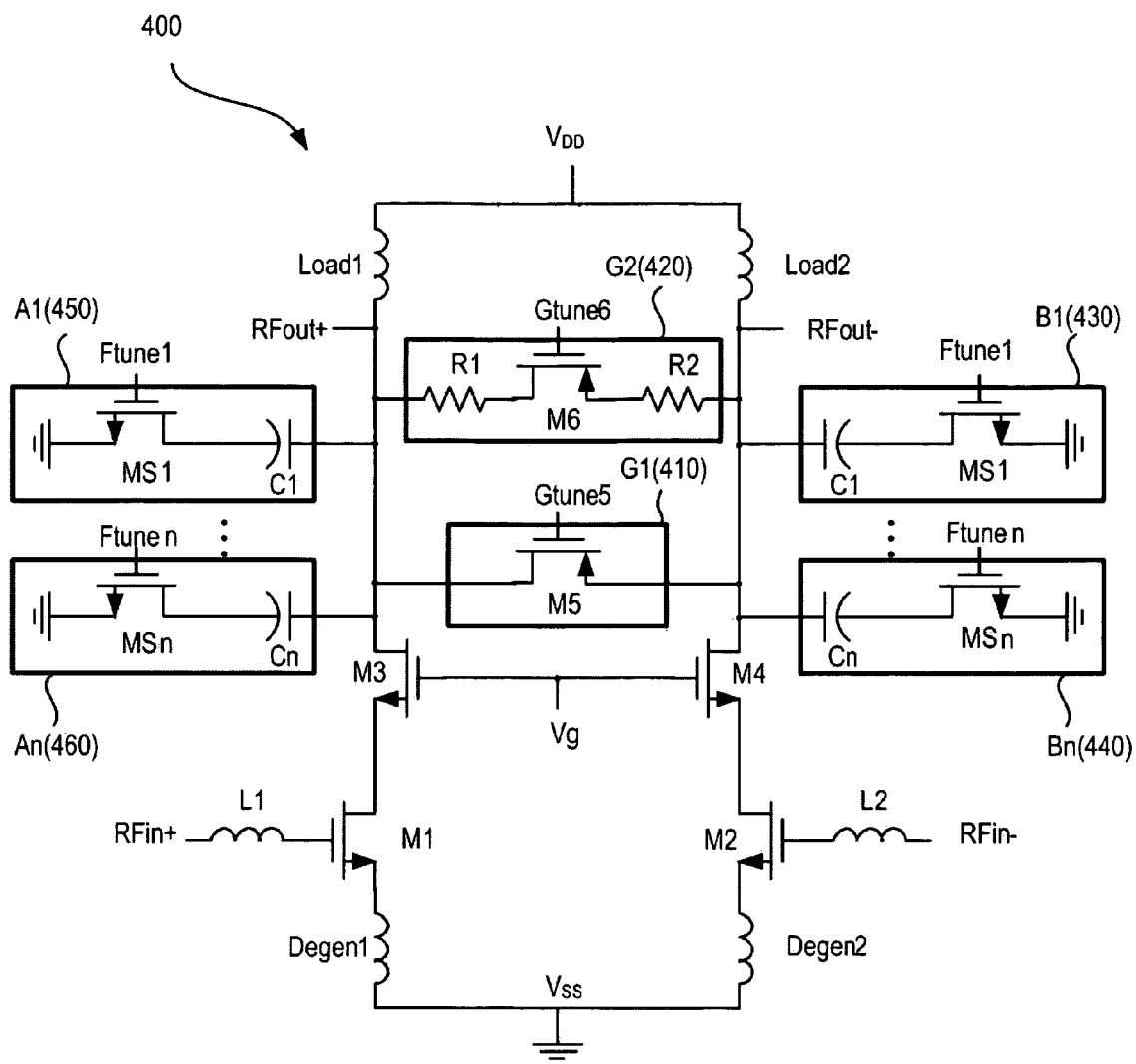
FIG. 4 is a diagram illustrating a broadband low noise amplifier according to another exemplary embodiment of the present invention.

FIG. 4 is a diagram illustrating a broadband low noise amplifier according to another exemplary embodiment of the present invention, which shows the first gain control part G1 310 and the second gain control part G2 320, a plurality of load tuning parts A1 350, . . . An 360, and B1 330, . . . Bn 340 that are depicted in FIG. 3.

The load tuning parts 430, 440, 450 and 460 of the broadband low noise amplifier 400 depicted in FIG. 4 may be constructed with capacitors and transistors to conduct switching operations. That is, the capacitors connected in parallel with a load stage of the broadband low noise amplifier 400 can be tuned to any desired values according to the frequency of the input RF signal.

The load tuning part An 460 has the same construction as the load tuning part A1 450, and is connected to an RFout+ load terminal of the broadband low noise amplifier 400; and load tuning parts B1 430, . . . Bn 440 have the same construction as the load tuning parts A1 450, . . . , An 460, and are connected to an RFout− load terminal.

The load tuning parts A1 450 and B1 430 receive the same switching signal Ftune1 in order to turn on or off transistor MS1 of the load tuning part A1 450 and transistor MS1 of the load tuning part B1 430 simultaneously.

Sizes of the capacitors and transistors comprising the load tuning parts A1 450, . . . , An 460 can be set so as to have proper values according to a desired bandwidth.

The load tuning part B1 430 is constructed with a capacitor and a transistor whose sizes are the same as those of the load tuning parts A1 450, and the load tuning part Bn 440 is constructed with a capacitor and a transistor identical in size to the load tuning part An 460.

Thus, when the broadband low noise amplifier 400 operates, switches of all the load tuning parts A1 450 to An 460 and B1 430 to Bn 440 are off when the frequency of the RF input signal is the highest, and the load of the broadband low noise amplifier 400 resonates at the highest frequency. When the capacitor and the inductor are parallel-resonant, the resonance frequency f is be expressed by Expression 1.

$$f = \frac{1}{2\pi\sqrt{LC}}$$ [Expression 1]

Thus, the resonance frequency increases as the capacitance values in the load tuning parts A1 450 to An 460 and B1 430 to Bn 440 approach 0.

In addition, when the frequency of the RF input signal is the lowest, the switches of all the load tuning parts A1 450 to An 460 and B1 430 to Bn 440 operate in the on state, and thus, the load of the broadband low noise amplifier 400 resonates at the lowest frequency. The total capacitance equals the sum of respective capacitance values, and referring to expression 1, this results in reducing the resonance frequency.

For the RF input signal having a wide frequency spectrum, by setting the switches constituting each of the load tuning parts to on/off states, the resonance impedance of the load may be set to the maximum in order to adapt to the input frequency. Thus, maximum gains can be obtained at the input frequency.

Naturally, a resonant point of the load is resonated by a load impedance including a parasitic component of the load and an input impedance including a parasitic component of a next stage.

Since the resonance frequency may be adjusted as described above, the broadband property of the low noise amplifier can be obtained.

The first gain control part G1 410 may be constructed of a p-channel metal oxide semiconductor (PMOS) transistor M5 to adjust gains of the broadband low noise amplifier 400. The PMOS transistor M5 is turned on and off by a switching signal Gtune 5. Additionally, other transistors known in the art may be used.

The second gain control unit G2 420 may consist of a PMOS transistor M6 to control gains of the broadband low noise amplifier 400, and resistances R1 and R2. The PMOS transistor M6 is turned on and off by a switching signal Gtune6. The second gain control part G2 420 changes the load impedance by turning on/off the PMOS transistor M6, thereby adjusting gains of the broadband low noise amplifier 400.

Generally, the gain G of the cascade amplifier depicted in FIG. 4 can be obtained using Expression 2.

G=gm*Rout, [Expression 2]

where gm represents a transconductance of transistors M1 and M2 in FIG. 4, and Rout represents an output impedance of the load.

Referring to FIG. 4, since the output terminals of the broadband low noise amplifier 400 are the drain terminals of M3 and M4, inductors Load1 and Load2, which are load impedances, resonate at the operating frequency with devices connected to the loads, thereby obtaining the maximum gain.

Gtune 5 of the first gain control part G1 410 and Gtune 6 of the second gain control part G2 420 are connected in parallel to Load1 and Load2.

If the transistors M5 and M6 are both in the off state, the total impedance of the loads becomes (load-impedance//∞) (transistors M5 and M6 are assumed to be infinite at the off state and '//' represents in parallel). As a result, the total impedance of the loads becomes the resonated load impedances, thereby having the highest gain.

When the transistors M5 and M6 are in the on state, drains and sources of the transistors M5 and M6 have the same DC voltage, and the current does not flow. At this time, the transistors M5 and M6 operate in the triode region, and drain-to-source impedance decreases in the on-state of the triode region. As a result, the minimum gain is obtained when the transistors M5 and M6 are both on.

Referring to the second gain control unit G2 420, since the transistor M6 is serially connected to resistors R1 and R2, it operates at the middle gain when the transistor M5 is off and the transistor M6 is on.

To summarize, the transistors M5 and M6 are in the off state when the maximum gain is set, but the transistor M5 is off and the transistor M6 is on when the middle gain is set.

The transistors M5 and M6 are both on when the minimum gain is set. At this time, the minimum gain may be set by setting only the transistor M5 to be on.

In FIG. 4, 22 gain modes may be obtained using the two gain control parts G1 410 and G2 420. However, gain control of the broadband low noise amplifier according to this exemplary embodiment is not limited thereto.

By comprising a single gain control part, the broadband low noise amplifier can realize a maximum gain and a minimum gain, or the broadband low noise amplifier may operate in any one of 2 n gain modes by using n gain control parts.

When only a single gain control part is used, either the first gain control part G1 410 or the second gain control part G2 420 may be selected.

Figure 5:
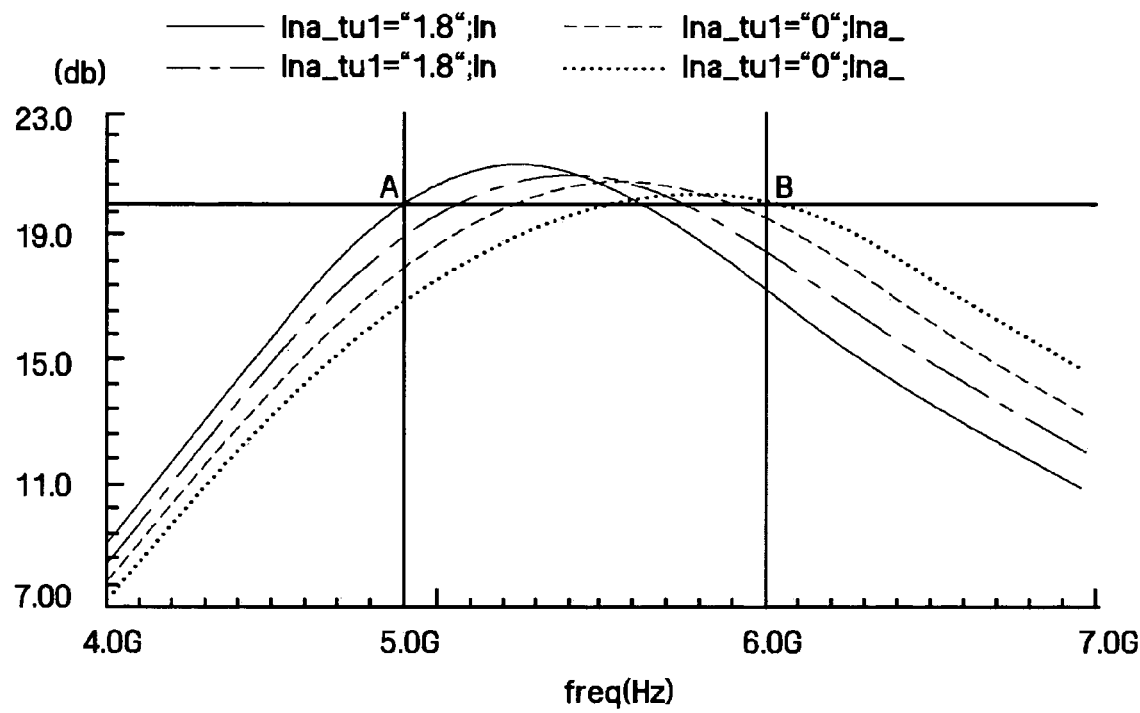
FIG. 5 is a graph showing results of a simulation according to an exemplary embodiment of the present invention.

FIG. 5 is a graph showing results of a simulation according to an exemplary embodiment of the present invention. In the circuit diagram of FIG. 4 n=2 in the load tuning parts for tuning into frequency bands.

Capacitors C1, C2 of the load tuning parts A1 450 and A2 460, and capacitors C1, C2 of the load tuning parts B1 430 and B2 440 (i.e. n=2) are interconnected in parallel to the load, and the capacitors are connected to grounds through transistors MS1 and MS2 of the load tuning parts A1 450 and A2 460, and transistors MS1 and MS2 of the load tuning parts B1 430 and B2 440 (i.e. n=2).

The x-axis of the graph represents an input frequency (GHz) and the y-axis represents gain (dB).

The B curve represents the off state of both of the transistors MS1 and MS2, where the gain is highest at the highest frequency.

The A curve represents the on state of both of the transistors MS1 and MS2, where the gain is highest at the lowest frequency.

That is, for the two curves between the markers A and B, the transistors MS1 and MS2 are either in the on-state or the off-state. At this time, values of the capacitors C1 and C2 may be determined in order to properly adapt to the operating frequencies.

As described above, the present invention is effective in broadening the bandwidth of a low noise amplifier by using load capacitors and switches of the low noise amplifier.

In addition, the present invention is effective in preventing gain reductions by adjusting the on/off states of switches and resonating them to a desired frequency even though the resonance point of the loads of the low noise amplifier varies.

The present invention is also effective in setting a desired gain level by adjusting the gain control unit.

Although the present invention has been described in connection with exemplary embodiments of the present invention, it will be apparent to those skilled in the art that various modifications and changes may be made thereto without departing from the scope and spirit of the invention. Therefore, it should be understood that the exemplary embodiments are not limitative, but illustrative in all aspects.

What is claimed is:

1. A broadband low noise amplifier comprising:
   an input terminal into which a radio frequency (RF) signal is input;
   an output terminal which outputs an amplified RF signal is output;
   at least one gain control part which is connected in parallel with loads of the output terminal to adjust a gain of the amplified RF signal; and
   at least one load tuning part which resonates with the loads of the output terminal to adjust a resonance frequency of an impedance of the loads;
   wherein the at least one load tuning part comprises a transistor and a capacitor connected to a source of the transistor to conduct switching operations.

2. The broadband low noise amplifier of claim 1, wherein the at least one gain control part operates using switching operations so that the gain is adjusted by the switching operations.

3. The broadband low noise amplifier of claim 2, wherein the at least one gain control part comprises a transistor which conducts the switching operations.

4. The broadband low noise amplifier of claim 1, wherein the at least one gain control part comprises a resistor and a transistor which conducts switching operations, and the transistor and resistor are serially connected.

5. The broadband low noise amplifier of claim 1, further comprising a plurality of gain control parts which are coupled to the output terminal.

6. The broadband low noise amplifier of claim 5, wherein each of the gain control parts comprise a transistor which conducts switching operations, and wherein the gain of the amplified RF signal is determined by the switching operations.

7. The broadband low noise amplifier of claim 1, further comprising a plurality of load tuning parts which are coupled to the output terminal.

8. The broadband low noise amplifier of claim 7, wherein each of the load tuning parts comprises a capacitor and a transistor to conduct switching operations, and the resonance frequency corresponds to a sum of capacitance values of the capacitors which are connected to ground according to the switching operations.

9. The broadband low noise amplified of claim 1, wherein the RF signal is input from an antenna to the input terminal.

10. A radio frequency (RF) signal amplification method comprising:
    inputting an RF signal into an input terminal; and
    amplifying the input RF signal and outputting the amplified RF signal to an output terminal,
    wherein a gain of the amplified RF signal is adjusted by switching operations of at least one switching device connected in parallel with a load of the output terminal, and a resonance frequency of an impedance of the load is determined according to a value of at least one capacitor that resonates with the load and is connected to a source of a transistor to conduct switching operations.

11. The RF signal amplification method of claim 10, wherein the switching operations are conducted by a transistor.

12. The RF signal amplification method of claim 10, wherein the at least one switching device is coupled to the output terminal.

13. The RF signal amplification method of claim 12, wherein the gain of the amplified RF signal is determined by switching operations of the at least one switching device.

14. The RF signal amplification method of claim 10, wherein the at least one capacitor is connected to a transistor and is set to resonate with the load if the transistor is switched on.

15. The RF signal amplification method of claim 10, wherein a plurality of capacitors are coupled to the output terminal.

16. The RF signal amplification method of claim 15, wherein the resonance frequency corresponds to a sum of capacitance values of the capacitors.

17. The RF signal amplification method of claim 10, wherein the RF signal is input from an antenna to the input terminal.

* * * * *